(12) United States Patent
Laforet et al.

(10) Patent No.: US 9,847,395 B2
(45) Date of Patent: Dec. 19, 2017

(54) SEMICONDUCTOR DEVICE INCLUDING A CONTACT STRUCTURE DIRECTLY ADJOINING A MESA SECTION AND A FIELD ELECTRODE

(71) Applicant: Infineon Technologies Austria AG, Villach (AT)

(72) Inventors: David Laforet, Villach (AT); Elisabeth Schwarz, Villach (AT); Beate Weissnicht, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/201,017

(22) Filed: Jul. 1, 2016

(65) Prior Publication Data
US 2017/0005171 A1 Jan. 5, 2017

(30) Foreign Application Priority Data

Jul. 3, 2015 (DE) .................. 10 2015 110 737

(51) Int. Cl.
| | |
|---|---|
| *H01L 29/40* | (2006.01) |
| *H01L 23/58* | (2006.01) |
| *H01L 29/10* | (2006.01) |
| *H01L 29/739* | (2006.01) |
| *H01L 29/861* | (2006.01) |
| *H01L 29/417* | (2006.01) |
| *H01L 29/423* | (2006.01) |
| *H01L 29/78* | (2006.01) |
| *H01L 29/06* | (2006.01) |

(52) U.S. Cl.
CPC .......... *H01L 29/404* (2013.01); *H01L 23/585* (2013.01); *H01L 29/0696* (2013.01); *H01L 29/407* (2013.01); *H01L 29/41725* (2013.01); *H01L 29/4238* (2013.01); *H01L 29/7397* (2013.01); *H01L 29/7813* (2013.01); *H01L 29/861* (2013.01)

(58) Field of Classification Search
None
See application file for complete search history.

(56) References Cited

U.S. PATENT DOCUMENTS

| | | | |
|---|---|---|---|
| 8,558,308 B1 * | 10/2013 | Blank ............... | H01L 29/66348 257/335 |
| 2004/0021173 A1 | 2/2004 | Sapp | |
| 2009/0140327 A1 * | 6/2009 | Hirao .................... | H01L 29/407 257/328 |
| 2010/0052044 A1 * | 3/2010 | Hirler ................. | H01L 29/7813 257/328 |

(Continued)

*Primary Examiner* — Khaja Ahmad
(74) *Attorney, Agent, or Firm* — Murphy, Bilak & Homiller, PLLC

(57) ABSTRACT

A semiconductor device includes a gate structure that extends from a first surface into a semiconductor portion and that surrounds a transistor section of the semiconductor portion. A field plate structure includes a field electrode and extends from the first surface into the transistor section. A mesa section of the semiconductor portion separates the field plate structure and the gate structure. A contact structure includes a first portion directly adjoining the mesa section and a second portion directly adjoining the field electrode. The first and second portions include stripes and are directly connected to each other.

20 Claims, 17 Drawing Sheets

(56) References Cited

U.S. PATENT DOCUMENTS

2010/0065903 A1* 3/2010 Parthasarathy ..... H01L 29/0657
                                                      257/329
2012/0276703 A1   11/2012 Grivna
2014/0015007 A1   1/2014  Werber et al.

* cited by examiner

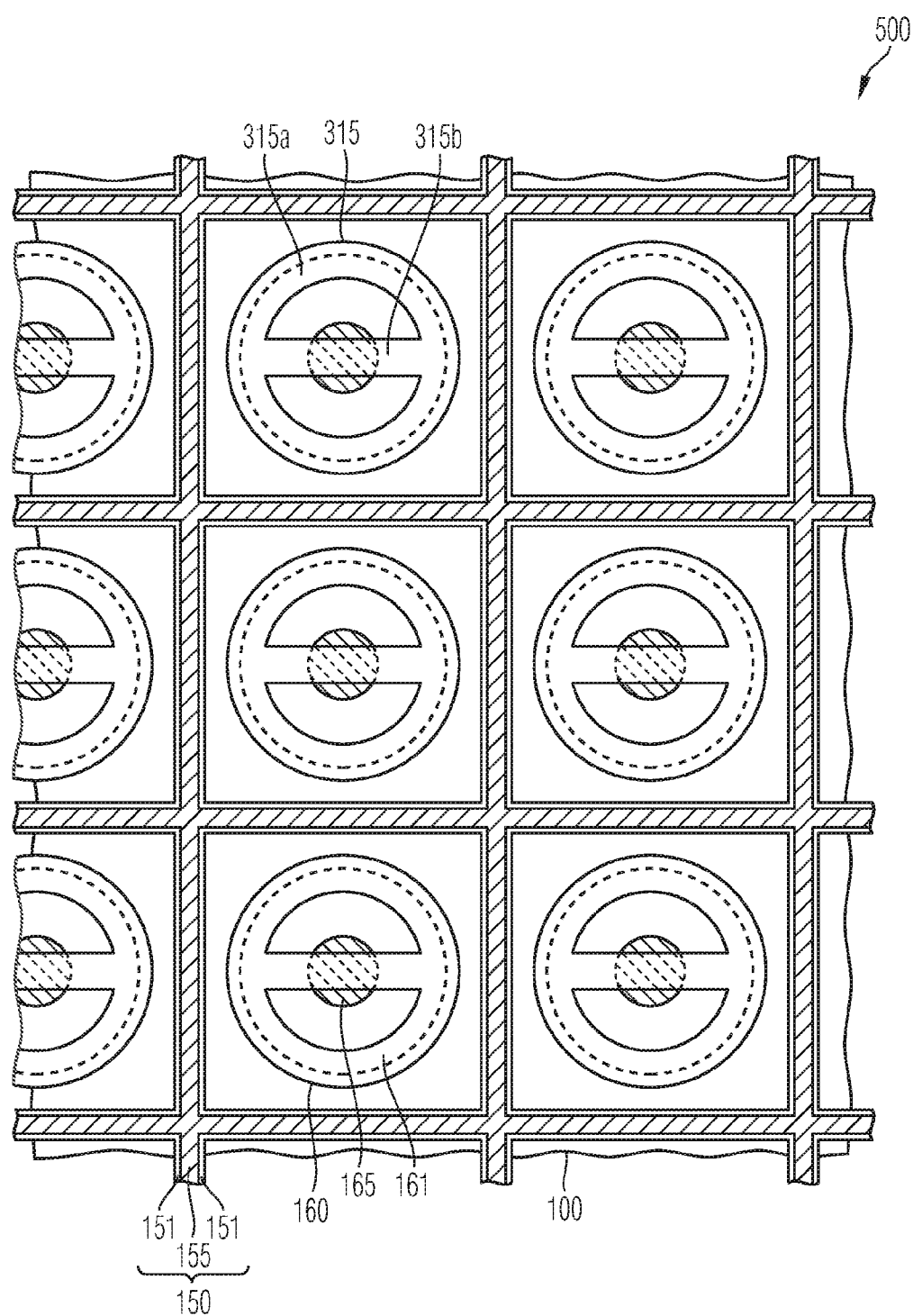

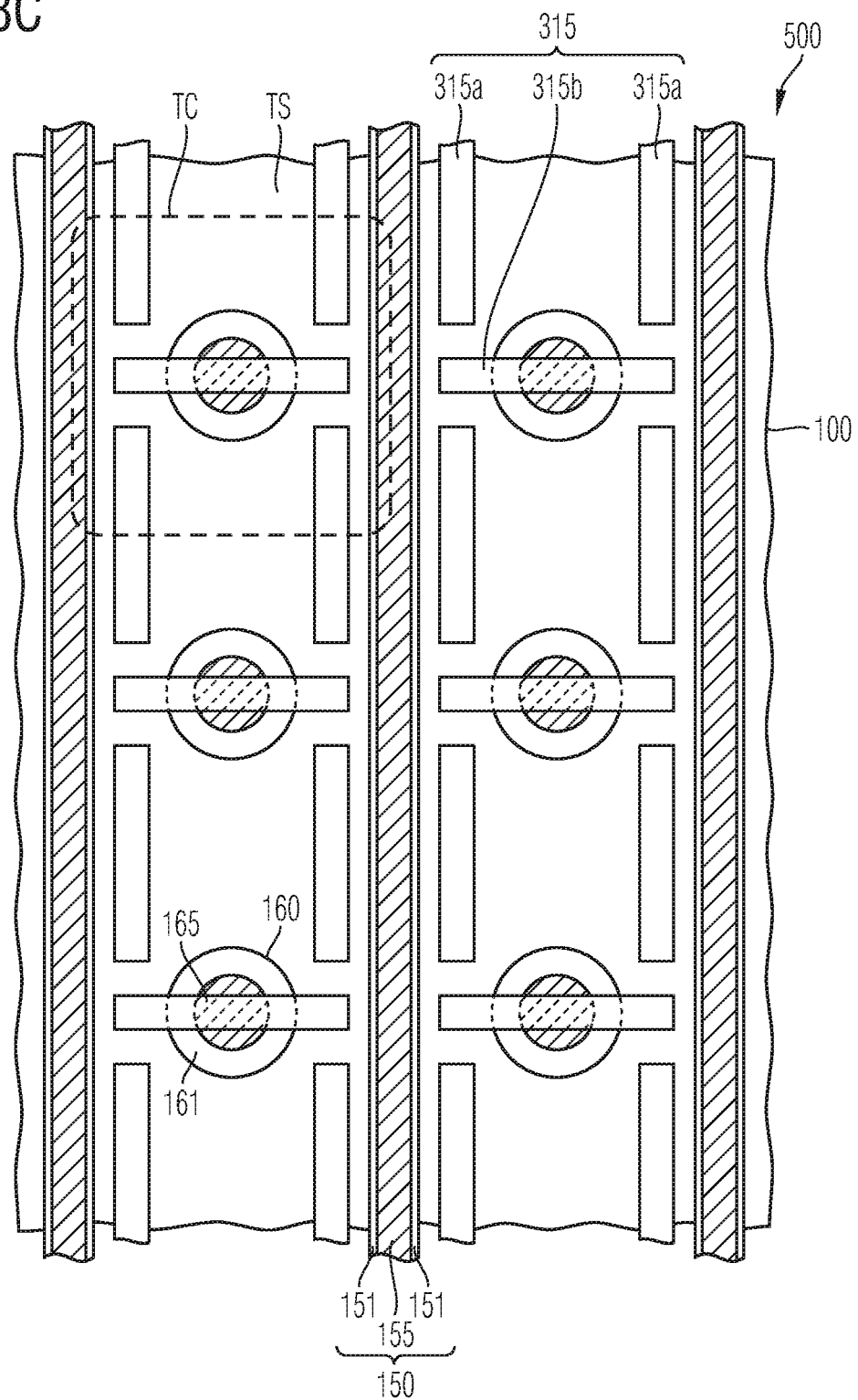

SEMICONDUCTOR DEVICE INCLUDING A CONTACT STRUCTURE DIRECTLY ADJOINING A MESA SECTION AND A FIELD ELECTRODE

BACKGROUND

In power semiconductor devices, for example IGFETs (insulated gate field effect transistors) a load current typically flows in a vertical direction between two load electrodes formed at opposing sides of a semiconductor die. In a blocking mode field plate structures extending from one side into the semiconductor die deplete a drift portion of the semiconductor die and facilitate higher dopant concentrations in the drift portion without adverse impact on the blocking capability. Shrinking the field plate structures to needle-shaped field plate structures increases an active transistor area and allows for increasing the total channel width by forming a gridlike gate structure between the field plate structures.

It is desirable to improve yield and reliability of semiconductor devices with needle-shaped field plate structures.

SUMMARY

According to an embodiment a semiconductor device includes a gate structure that extends from a first surface into a semiconductor portion and that surrounds a transistor section of the semiconductor portion. A field plate structure includes a field electrode and extends from the first surface into the transistor section. A mesa section of the transistor section separates the field plate structure and the gate structure. A contact structure includes a first portion directly adjoining the mesa section and a second portion directly adjoining the field electrode. The first and second portions include stripes and are directly connected to each other.

According to another embodiment a semiconductor device includes gate structures that extend from a first surface into a semiconductor portion. Transistor sections of the semiconductor portion are formed between neighboring ones of the gate structures. Spicular field plate structures extend from the first surface into the transistor sections and include field electrodes. Mesa sections of the transistor sections separate the field plate structures from each other and from the gate structures. Contact structures include first portions directly adjoining the mesa sections and second portions directly adjoining the field electrodes. The first and second portions include stripes.

According to a further embodiment an electronic assembly includes a semiconductor device with a gate structure that includes a gate electrode, extends from a first surface into a semiconductor portion, and surrounds a transistor section of the semiconductor portion. A field plate structure includes a field electrode and extends from the first surface into the transistor section. A mesa section of the transistor section separates the field plate structure and the gate structure. A contact structure includes a first portion directly adjoining the mesa section and a second portion directly adjoining the field electrode. The first and second portions include stripes and are directly connected to each other. A gate driver circuit is electrically connected or coupled to the gate electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 7C is a schematic horizontal cross-sectional view of a portion of a semiconductor device according to an embodiment in which the contact structures overlap with a field dielectric.

FIG. 8C is a schematic horizontal cross-sectional view of a portion of a semiconductor device according to another embodiment including stripe-shaped gate structures and contact structures with discontinuous first portions.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
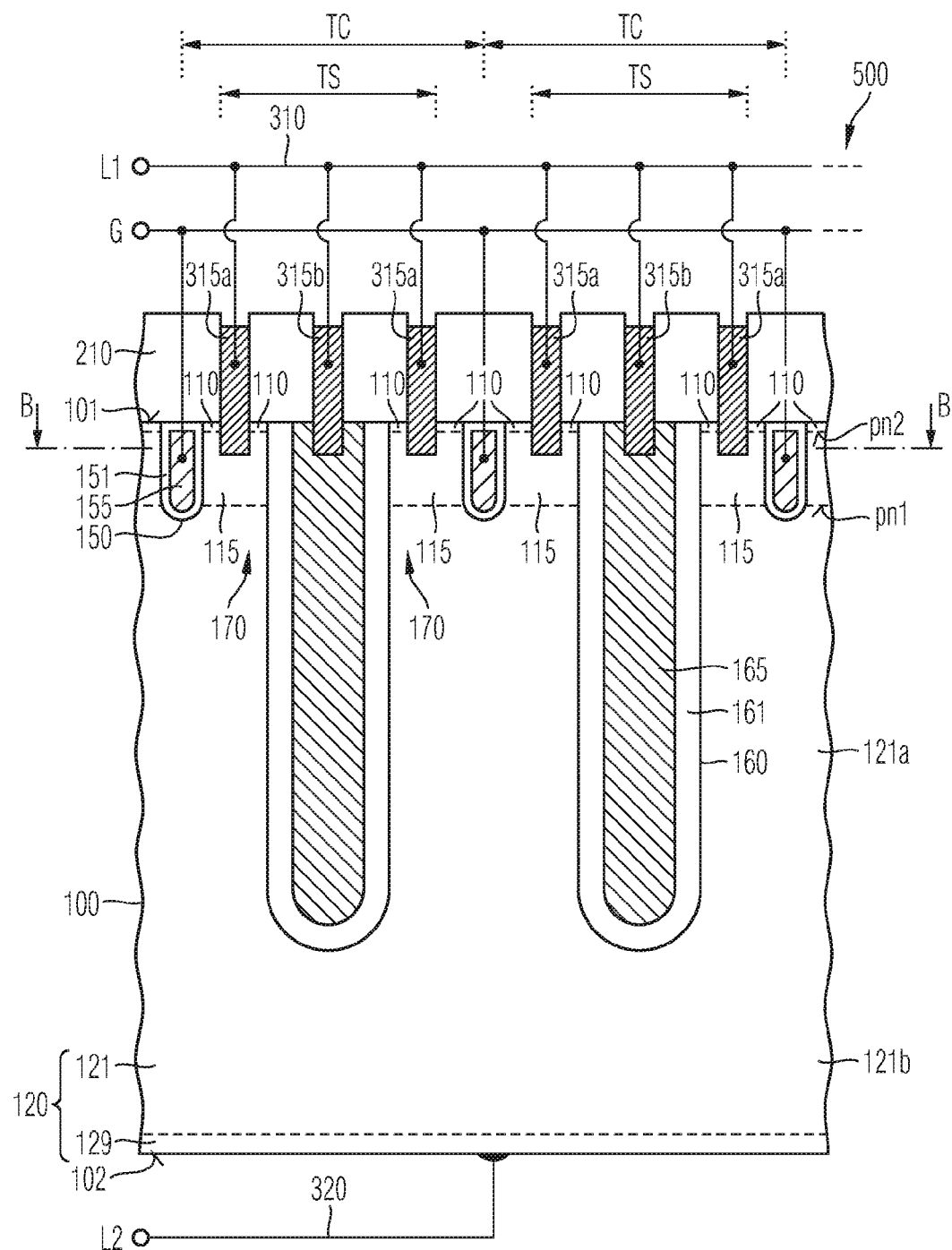
FIG. 1A is a schematic vertical cross-sectional view of a portion of a semiconductor device including a contact structure with line-shaped first and second portions according to an embodiment.
Figure 1B:
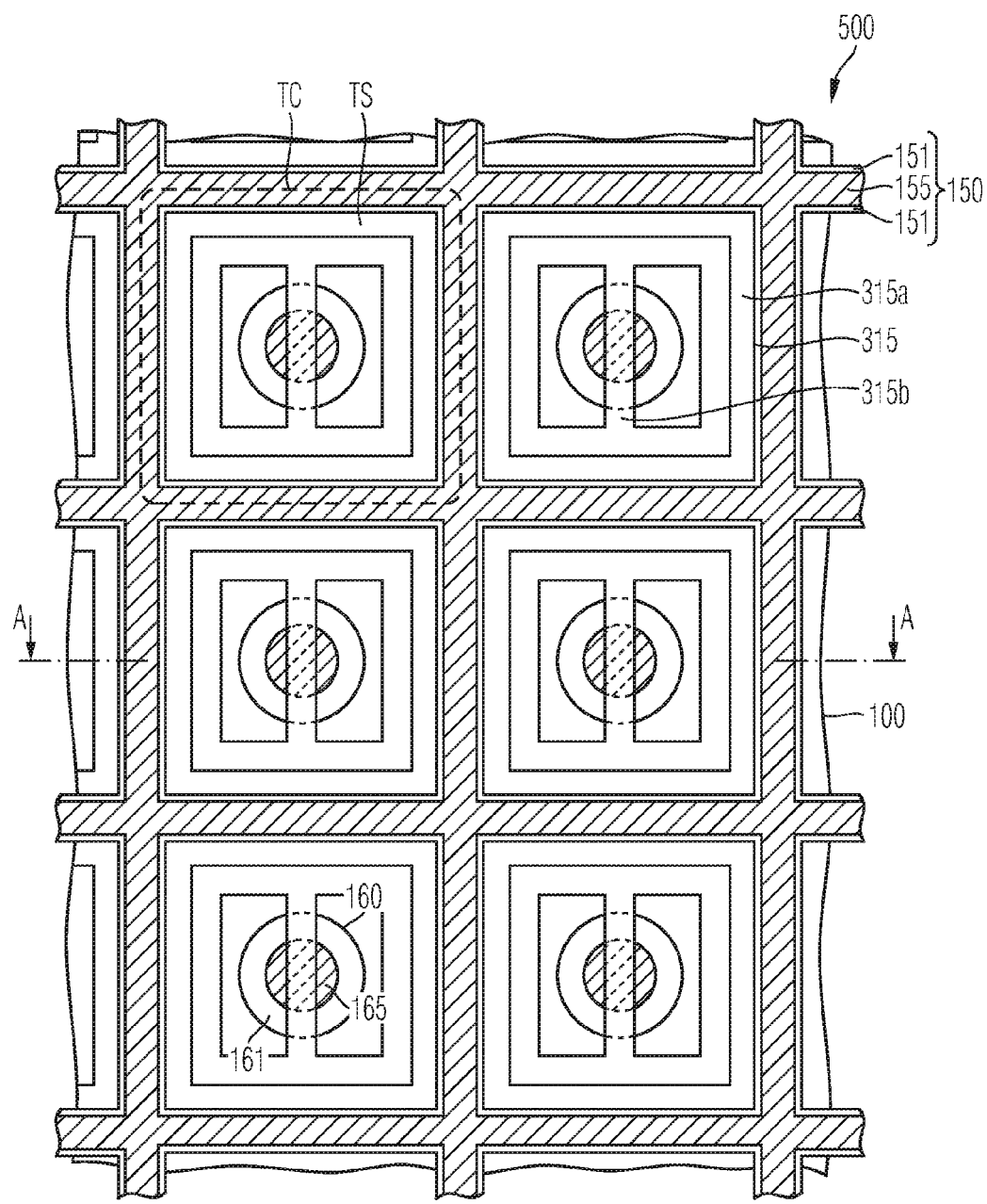
FIG. 1B is a schematic horizontal cross-sectional view of the semiconductor device portion of FIG. 1A along line B-B according to an embodiment including a gate structure forming a grid pattern.
Figure 1C:
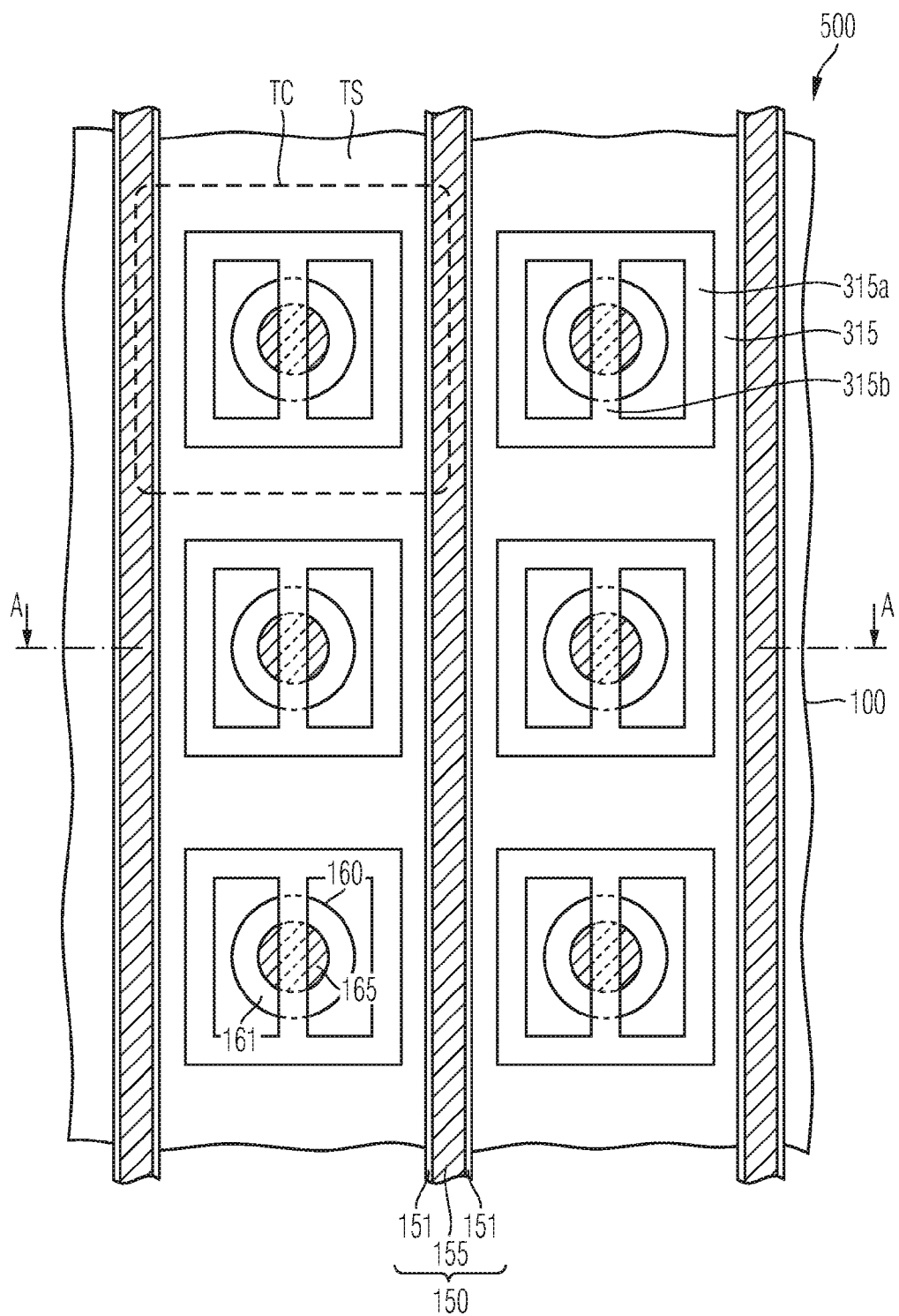
FIG. 1C is a schematic horizontal cross-sectional view of the semiconductor device portion of FIG. 1A along line B-B according to an embodiment including a gate structure forming a stripe pattern.

FIGS. 1A to 1C refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT (insulated gate bipolar transistor) or an MCD (MOS controlled diode).

The semiconductor device 500 is based on a semiconductor portion 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

FIG. 1A shows the semiconductor portion 100, which has a first surface 101 which may be approximately planar or which may be defined by a plane spanned by coplanar surface sections as well as a planar second surface 102 parallel to the first surface 101. A distance between the first and second surfaces 101, 102 depends on a voltage blocking capability the semiconductor device 500 is specified for and may be at least 20 μm. According to other embodiments, the distance may be in the range of several hundred μm. A lateral surface is tilted to the first and second surfaces 101, 102 and connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

The semiconductor portion 100 includes a drift structure 120 of a first conductivity type as well as a contact portion 129 between the drift structure 120 and the second surface 102. The drift structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E14$ $cm^{-3}$ and $1E18$ $cm^{-3}$, for example, in a range from $5E15$ $cm^{-3}$ to $1E17$ $cm^{-3}$. For a silicon-based semiconductor portion 100 the mean dopant concentration in the drift zone 121 may be between $1E15$ $cm^{-3}$ and $1E17$ $cm^{-3}$, for example, in a range from $5E15$ $cm^{-3}$ to $5E16$ $cm^{-3}$.

The contact portion 129 may be a heavily doped base substrate or a heavily doped layer. Along the second surface 102 a dopant concentration in the contact portion 129 is sufficiently high to form an ohmic contact with a metal directly adjoining the second surface 102. In case the semiconductor portion 100 is based on silicon, in an n-conductive contact portion 129 the dopant concentration along the second surface 102 may be at least $1E18$ $cm^{-3}$, for example at least $5E19$ $cm^{-3}$. In a p-conductive contact portion 129, the dopant concentration may be at least $1E16$ $cm^{-3}$, for example at least $5E17$ $cm^{-3}$. For IGFETs and semiconductor diodes, the contact portion 129 has the same conductivity as the drift zone 121. For IGBTs the contact portions 129 may have the complementary second conductivity type or may include zones of both conductivity types.

The drift structure 120 may include further doped regions, e.g., a field stop layer or a buffer zone between the drift zone 121 and the contact portion 129, barrier zones as well as counterdoped regions.

A gate structure 150 extends from the first surface 101 into the semiconductor portion 100. The gate structure 150 may form a regular stripe pattern including regularly arranged gate stripes separating transistor sections TS of the semiconductor portion 100. According to an embodiment the gate structure forms a grid pattern and meshes of the grid surround the transistor sections TS of the semiconductor portion 100. The gate structure 150 includes a conductive gate electrode 155, which includes or consists of a heavily doped polycrystalline silicon layer and/or a metal-containing layer. The gate electrode 155 is insulated against the semiconductor portion 100, wherein a gate dielectric 151 may separate the gate electrode 155 from at least portions of the semiconductor portion 100.

The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or any combination thereof. The gate electrode 155 may be electrically connected or coupled to a gate terminal G of the semiconductor device 500 or to an output of an internal driver circuit.

The vertical extension of the gate structures 150 may be in a range from 100 nm to 5000 nm, for example in a range from 300 nm to 1000 nm. A width of the gate structure 150 may be at least 150 nm, for example at least 200 nm.

Spicular field plate structures 160 extend from the first surface 101 into the transistor sections TS of the semiconductor portion 100. Portions of the spicular field plate structures 160 between the first surface 101 and buried end portions may have approximately vertical sidewalls or may slightly taper at an angle of, e.g., 89 degrees with respect to the first surface 101. The sidewalls may be straight or slightly bulgy.

The field plate structures 160 are needle-shaped with dot-shaped horizontal cross-section areas. A plurality of spicular field plate structures 160 with the same horizontal cross-sectional area may be arranged along parallel lines.

The field plate structures 160 include a conductive field electrode 165 and a field dielectric 161 surrounding the field electrode 165, respectively. The field electrode 165 includes or consists of a heavily doped silicon layer and/or a metal-containing layer. The field dielectric 161 separates the field electrode 165 from the surrounding semiconductor material of the semiconductor portion 100 and may include or consist of a thermally grown silicon oxide layer, a deposited silicon oxide layer, e.g., a silicon oxide based on TEOS (tetraethyl orthosilicate), or any combination thereof.

A vertical extension of the spicular field plate structures 160 is greater than that of the gate structures 150 and smaller than a distance between the first surface 101 and the contact portion 129 such that a continuous drift zone section 121b is formed between the field electrode structures 160 and the contact portion 129 and such that a perforated drift zone section 121a horizontally embeds the field plate structures 160. The vertical extension of the field plate structures 160 may be in a range from 1 µm to 50 µm, for example in a range from 2 µm to 20 µm. A first horizontal extension of the field plate structures 160 may be in a range from 0.1 µm to 20 µm, for example in a range from 0.2 µm to 5 µm.

A second horizontal extension of the field electrode 165 orthogonal to the first horizontal extension may be at most three times or at most twice as large as the first horizontal extension, wherein the cross-sectional areas of the field electrodes 165 and the field plate structures 160 may be rectangles, or regular or distorted polygons with or without rounded and/or beveled corners, ellipses or ovals, respectively.

According to an embodiment, the first and second horizontal extensions are at least approximately equal and the cross-sectional areas of the field electrodes 165 and the field plate structures 160 are circles or regular polygons with or without rounded or beveled corners, such as octagons, hexagons or squares.

The field plate structures 160 facilitate high dopant concentrations in the drift zone 121 without adverse impact on the blocking capability of the semiconductor device 500. Needle-shaped field electrodes 165 increase the available cross-sectional area for the drift zone 121 and therefore reduce the on-state resistance RDSon compared to stripe-shaped field electrodes.

The transistor sections TS, which include the semiconducting portions of the transistor cells TC, protrude from a continuous section of the semiconductor portion 100 between the field electrode structures 160 and the second surface 102 and include the perforated drift zone section 121a. A horizontal mean width of the transistor sections TS may be in a range from 0.2 µm to 10 µm, for example in a range from 0.3 µm to 1 µm.

Mesa sections 170 of the transistor sections TS between the gate structure 150 and the field plate structures 160 include body zones 115 of the second conductivity type. The body zones 115 form first pn junctions pn1 with the drift structure 120, e.g., with the first drift zone section 121a, and second pn junctions pn2 with source zones 110 formed between the body zones 115 and the first surface 101. A distance between the first pn junctions pn1 and the first surface 101 may be equal to or smaller than a vertical extension of the gate structures 150. The body zones 115 completely surround the field plate structures 160 in a horizontal plane. The gate dielectric 151 capacitively couples the gate electrode 155 to channel portions of the body zones 115.

The source zones 110 may be wells extending from the first surface 101 into the semiconductor portion 100, for example into the body zones 115. One source zone 110 may surround the respective spicular field plate structure 160 in a horizontal plane or two or more separated source zones 110 may be formed in each transistor section TS. The source zones 110 may be spaced from the spicular field plate structures 160 or may directly adjoin the spicular field plate structures 160.

The field electrodes 165, the source zones 110 as well as the body zones 115 are electrically connected to a first load electrode 310. The first load electrode 310 may be electrically coupled or connected to a first load terminal L1, which is, for example, a source terminal in case the semiconductor device 500 is an IGFET, an emitter terminal in case the semiconductor device 500 is an IGBT or an anode terminal in case the semiconductor device 500 is a semiconductor diode.

A second load electrode 320, which directly adjoins the second surface 102 and the contact portion 129, may form or may be electrically connected to a second load terminal L2, which may be a drain terminal in case the semiconductor device 500 is an IGFET, a collector terminal in case the semiconductor device 500 is an IGBT or a cathode terminal in case the semiconductor device 500 is a semiconductor diode.

In the illustrated embodiments and for the following description, the body zones 115 are p-type and the source zones 110 as well as the drift zone 121 are n-type. Similar considerations as outlined below apply also to embodiments with n-type body zones 115 in combination with p-type source zones 110 as well as a p-type drift zone 121.

When a gate voltage applied to the gate electrode 150 exceeds a preset threshold voltage, electrons accumulate in the channel portions of the body zones 115 directly adjoining the gate dielectric 151 and form inversion channels by-passing the second pn-junctions pn2 for electrons in a forward biased state of the semiconductor device 500 with a positive voltage applied between the drift structure 120 and the source zones 110. In response to the gate voltage exceeding the threshold voltage, a load current flows between the first and second load terminals L1, L2 in the vertical direction through the semiconductor portion 100.

A dielectric structure 210 is formed on the first surface 101 and electrically separates the gate electrodes 155 from, e.g., the first load electrode 310. Contact structures 315 extend through the dielectric structure 210 and electrically connect the first load electrode 310 with the field electrode 165, the source zones 110 and the body zones 115.

Each contact structure 315 includes line-shaped first and second portions 315a, 315b, wherein the first portion 315a directly adjoins the mesa section 170 and the second portion 315b directly adjoins the field electrode 165 of the same transistor cell TC. Each of the first and second portions 315a, 315b includes or consists of one or more stripes of uniform width, wherein a length of a stripe is at least twice a width of the stripe. Each stripe may be straight or may be bowed.

The first portion 315a may form a closed frame surrounding the field plate structure 160. According to an embodiment the first portion 315a may include or consist of four or more straight stripes that form a closed frame, wherein corners of the frame may be sharp, rounded or beveled. Alternatively, or in addition, the first portion 315a may include or consist of one or more bowed stripes. For example, the first portion 315a includes or consists of a stripe forming an oval ring, e.g., a circular ring.

The second portion 315b includes or consists of at least one straight stripe that directly adjoins to the first portion 315a with at least one end face in a horizontal plane and that extends in an opening of the first portion 315a from the first portion 315a to at least a vertical projection of the field electrode 165.

Forming, for each transistor cell TC, one solid contact structure extending across the whole field plate structure 160 and directly adjoining portions of the mesa sections 170 results in wide contact openings, which are typically not completely filled during deposition of a conductive fill layer from e.g., tungsten. When patterning the deposited fill layer by depositing and exposing a photoresist on the deposited fill layer, the photoresist mainly fills the remaining gaps in the contact openings but covers portions of the fill layer above the portions of the dielectric structure 210 only at a low layer thickness. During a photolithographic process for patterning the deposited fill layer by using the photoresist, e.g., for removing portions of the deposited fill layer beneath metal gate constructions such as gate pads, gate fingers and gate runners, the deposited fill layer may be opened unintentionally also in regions where the photoresist shall cover the deposited fill layer.

On contrast, forming two-part contact structures 315 from separated portions may result in sufficiently narrow contact openings which are typically approximately completely filled during deposition of the fill layer. The surface of the deposited fill layer is comparatively smooth and a resist layer deposited on the smooth surface of the deposited fill layer reliably covers the shadowed portions of the deposited fill layer during patterning of the deposited fill layer.

Forming a two-part contact structure 315 from a frame-like first portion and a comparatively large dot portion may result in contact openings with remnant dielectric cylinders of the material of the dielectric structure 210. The dielectric cylinder walls are thin and may collapse during processes performed after etch of the contact openings and before depositing the fill layer or even during deposition of the fill layer. Contact openings with collapsed dielectric cylinders show the same effect as the solid contacts discussed above.

Forming a two-part contact structure 315 from a frame-like portion and a comparatively small dot portion to increase thickness and to enhance stability of the dielectric cylinders may result in small lithographic process windows and large deviations of the size of the small dots. In case the dots get too narrow, the deposited fill layer does not reliably fill the contact openings to the field electrodes due to a critical aspect ratio.

On contrast, the contact structures 315 according to the embodiments include line sections. Formation of the line sections is less critical as regards a photolithographic process window. The lines can be sufficiently narrow such that the deposited fill layer can reliably fill the contact openings. The contact structures according to the embodiments enhance process yield and improve device reliability.

In FIG. 1B a gate structure 150 forms a grid pattern wherein meshes of the grid surround the transistor sections TS of the transistor cells TC. The transistor cells TC are arranged in regularly spaced lines. In the illustrated embodiment, the transistor cells TC form a matrix with orthogonal lines and rows. According to other embodiments, neighboring lines of transistor cells TC may be shifted to each other at a distance smaller than a center-to-center distance between neighboring transistor cells TC.

In FIG. 1C the gate structure 150 forms a stripe pattern of regularly arranged gate stripes, wherein the transistor sections TS of a plurality of transistor cells TC is formed between pairs of neighboring gate stripes, respectively.

Figure 2:
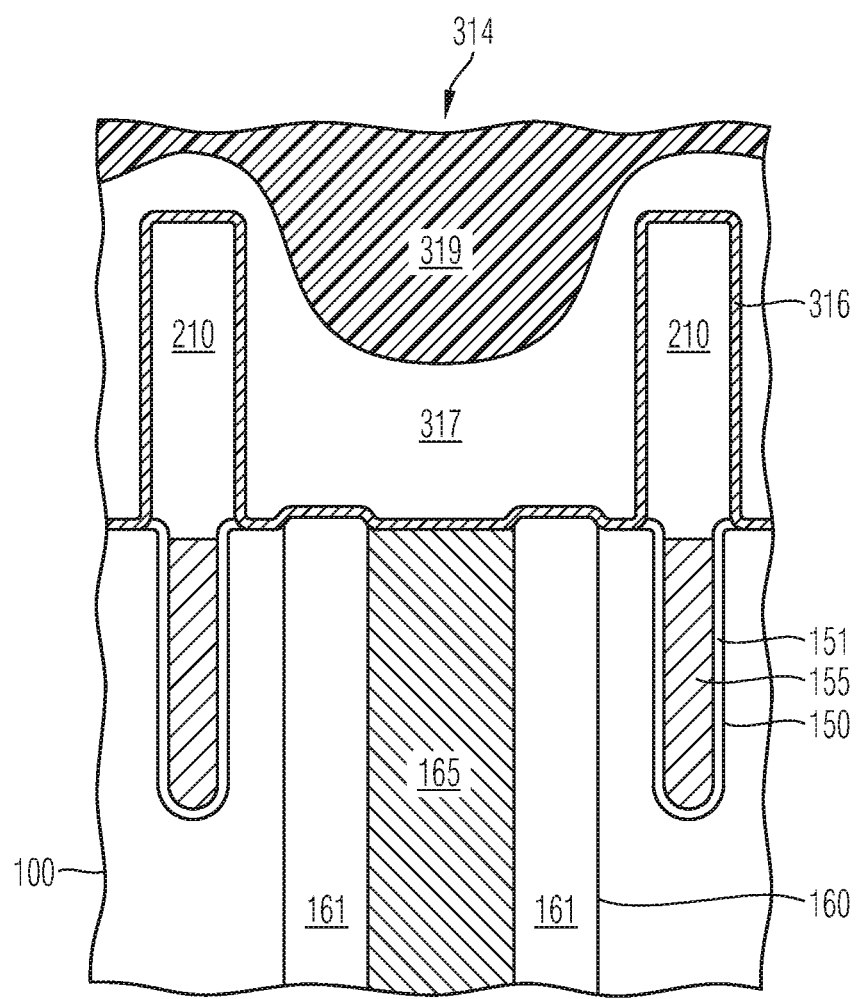
FIG. 2 is a schematic cross-sectional view through a portion of a semiconductor substrate including a solid contact structure according to a first reference example for illustrating effects of the embodiments.

FIG. 2 is a schematic cross-sectional view of a contact opening 314 for a solid contact in a dielectric structure 210 according to a first comparative example. The contact opening 314 is in a vertical projection of a field plate structure 160, wherein vertical center axes of the field plate structure 160 and the contact opening 314 approximately coincide. Portions of the dielectric structure 210 are in the vertical projection of the gate structures 150. The contact opening 314 may have a vertical extension of about 1 µm and a horizontal extension of about 1 µm.

A conductive barrier layer 316 containing or consisting of tantalum (ta), titanium (Ti), e.g., a titanium nitride layer lines the contact opening 314 and covers the dielectric structure 210. A metallic fill layer 317 fills a lower portion of the contact opening 314 but does not fill the contact opening 314 completely. A thickness of the metallic fill layer 317 above the dielectric structure 210 is significantly lower than in the center of the contact opening 314. A resist layer 319 predominantly fills the remaining gap in the contact opening 314 and covers portions of the metallic fill layer 317 on the dielectric structure 210 at a low layer thickness such that it can be unintentionally removed in portions not intended for being opened in a later lithographic process, e.g., in a process for removing portions of the metallic fill layer 317 beneath metallic gate structures, e.g., gate pads, gate fingers and/or gate runners.

Figure 3A:
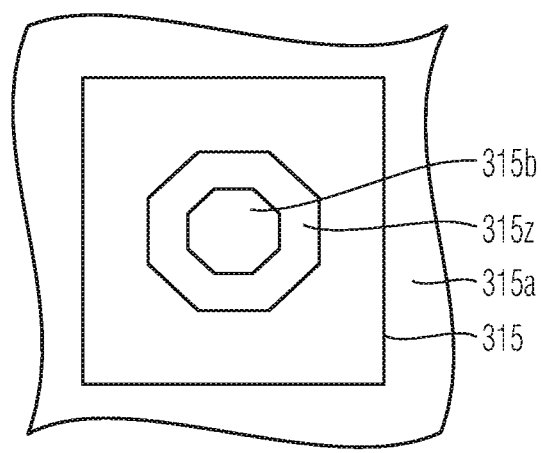
FIG. 3A is a schematic plan view of a two-part contact structure according to a second reference example for illustrating effects of the embodiments.

FIG. 3A is a plan view of a further comparative example of a contact structure 315 with a first portion 315a forming a frame with a square outline and an octagonal opening 315z as well as a concentric octagonal second portion 315b in the octagonal opening 315z of the first portion 315a.

Figure 3B:
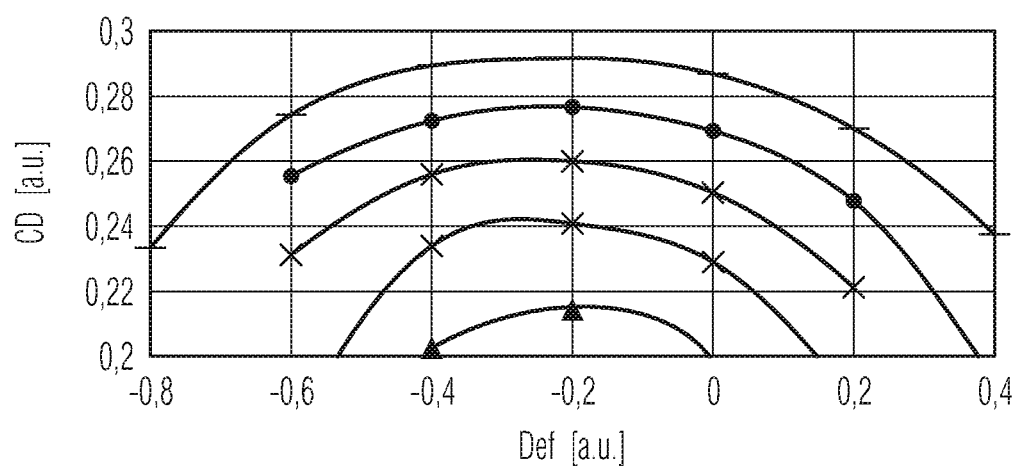
FIG. 3B is a schematic diagram illustrating a lithography process window for the contact structure of FIG. 3A.

FIG. 3B shows Bossung curves descriptive for a lithography process window for the comparative example of FIG. 3A using a conventional illumination setting at an NA (numerical aperture) equal to 0.55 and a σ-value equal to 0.55 for different illumination energies. For all illumination energies a defocus of 0.4 arbitrary units results in a significant variation of a critical dimension CD descriptive for a diameter of the dot-like second portion 315b. If the dot is imaged too small, the resulting contact opening above a field electrode may be too narrow to be reliably filled with conductive material.

Figure 4A:
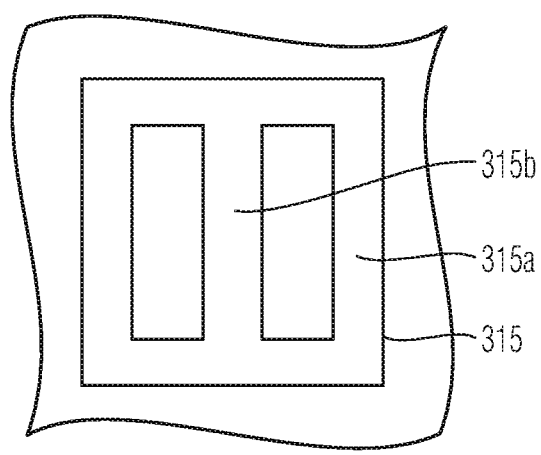
FIG. 4A is a schematic plan view of a contact structure according to an embodiment with first and second portions including stripes.

FIG. 4A shows a contact structure 315 according to an embodiment with the first portion 315a including four stripes forming a square frame and a second portion 315b consisting of a stripe parallel to an edge of the frame and crossing a frame center. The dimension of the outlines of the contact structures 315 of FIG. 3A and FIG. 4A are identical.

Figure 4B:
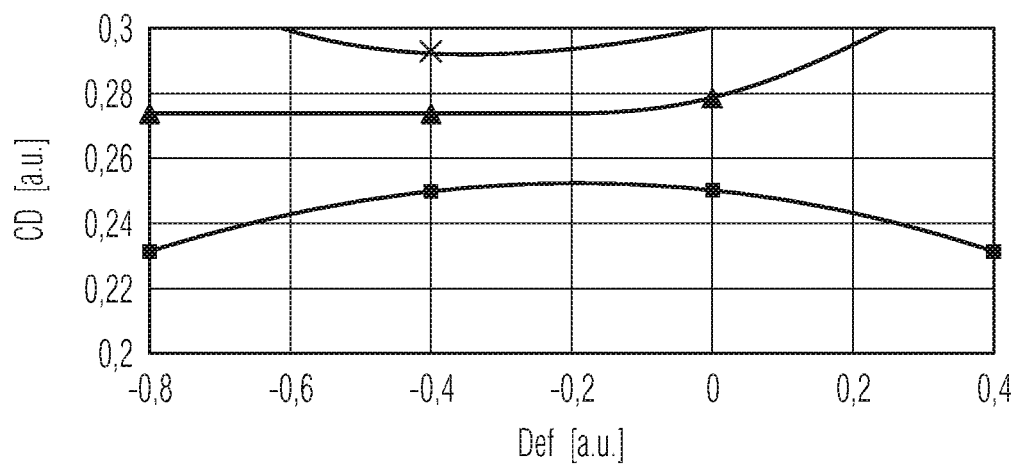
FIG. 4B is a schematic diagram illustrating a lithography process window for the contact structure of FIG. 4A.

FIG. 4B shows Bossung curves for the contact structure 315 of FIG. 4A at an NA equal to 0.55 and a σ-value of 0.55 at different illumination energies. A defocus of 0.4 arbitrary units results in a significantly reduced variation of a critical dimension CD representative for a width of the stripes of the first and second portions 315a, 315b of the contact structure 315.

FIGS. 5A to 5E refer to embodiments of the contact structure 315.

Figure 5A:
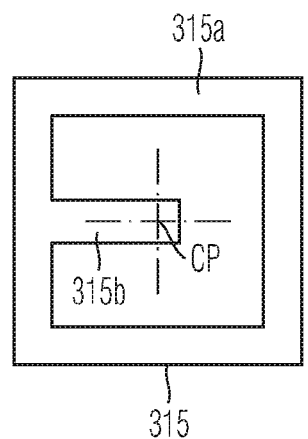
FIG. 5A is a schematic horizontal cross-sectional view of an embodiment of a contact structure including a first portion forming a rectangular frame and a second portion forming a stub.

In FIG. 5A the first portion 315a includes four stripes that form a square frame. The second portion 315b consists of one stripe that forms a stub extending from the center of one side of the frame into the frame. One end face of the second portion 315b is directly connected to the frame and the other end face is without connection to the frame. The second portion 315b may extend up to the center CP of the frame or to beyond the center CP of the frame. The stripes of the first and second portions 315a, 315b may have approximately the same width, wherein a deviation of the widths of the stripes of the same contact structure 315 may be at most 10%. According to an embodiment, all stripes of the same contact structure 315 have the same width.

Figure 5C:
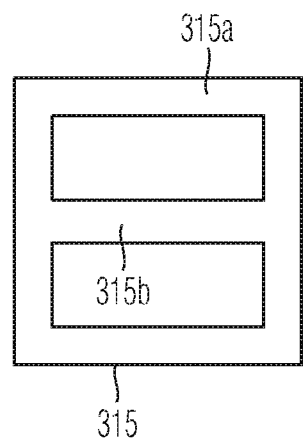
FIG. 5C is a schematic horizontal cross-sectional view of an embodiment of a contact structure including a first portion forming a rectangular frame and a second portion including a straight stripe extending through an opening of the frame.
Figure 5B:
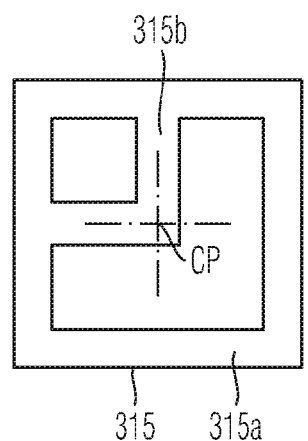
FIG. 5B is a schematic horizontal cross-sectional view of an embodiment of a contact structure including a first portion forming a rectangular frame and a second portion including two stripes forming a right-angle.

In FIG. 5B the second portion 315b includes two stripes forming a rectangle in the center CP of the frame.

FIG. 5C shows a contact structure 315 which second portion 315b consists of one stripe that extends from one side of the frame to the opposite side. Both end faces of the stripe are directly connected to the first portion 315a. A longitudinal axis of the stripe forming the second portion 315b may be parallel to an edge of the frame. According to other embodiments, the longitudinal axis of the second stripe forming the portion 315b may be tilted to an adjoining edge of the frame at an angle between 45° and 90°.

As regards an alignment of the contact structure 315 to the field electrodes 165, a stripe-shaped second portion 315b extending through the center point CP of the first portion 315a is insensitive to a displacement between the contact structure 315 and the field electrode along the longitudinal axis of the second portion 315b.

Figure 5D:
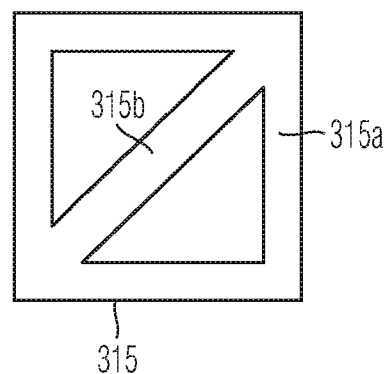
FIG. 5D is a schematic horizontal cross-sectional view of an embodiment of a contact structure including a first portion forming a square frame and a second portion including a straight stripe diagonally crossing an opening of the square frame.

In FIG. 5D the second portion 315b includes one stripe that diagonally crosses a square frame formed by the first portion 315a.

Figure 5E:
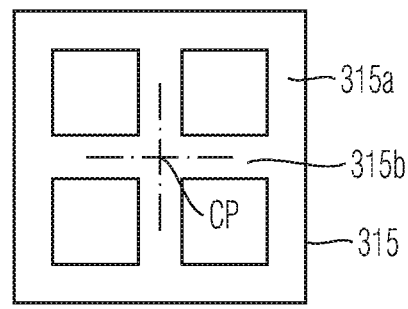
FIG. 5E is a schematic horizontal cross-sectional view of an embodiment of a contact structure with a first portion forming a square frame and a second portion including straight stripes forming a cross.

In FIG. 5E the second portion 315b includes two stripes crossing the center CP of the frame such that the overlay is insensitive to either the longitudinal axis of the first stripe or to the longitudinal axis of the second stripe.

Figure 5F:
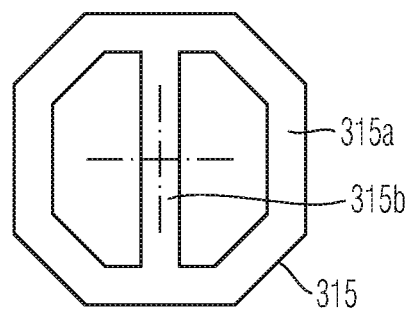
FIG. 5F is a schematic horizontal cross-sectional view of an embodiment of a contact structure with a first portion forming an octagonal frame.

The contact structure 315 of FIG. 5F includes eight stripes forming an octagonal frame, which can be combined with any of the second portions 315b of FIGS. 5A to 5E.

Figure 5G:
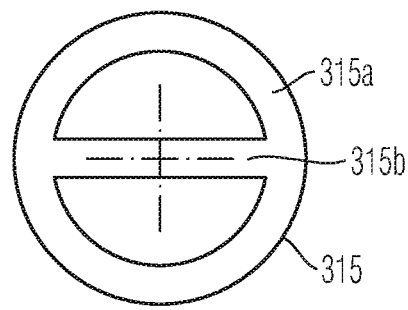
FIG. 5G is a schematic horizontal cross-sectional view of an embodiment of a contact structure including a first portion forming a ring.

FIG. 5G shows a contact portion 315 with a first portion 315a including a stripe forming a ring. The first portion 315a of FIG. 5G can be combined with any of the second portions 315b of FIGS. 5A to 5E.

Figure 6A:
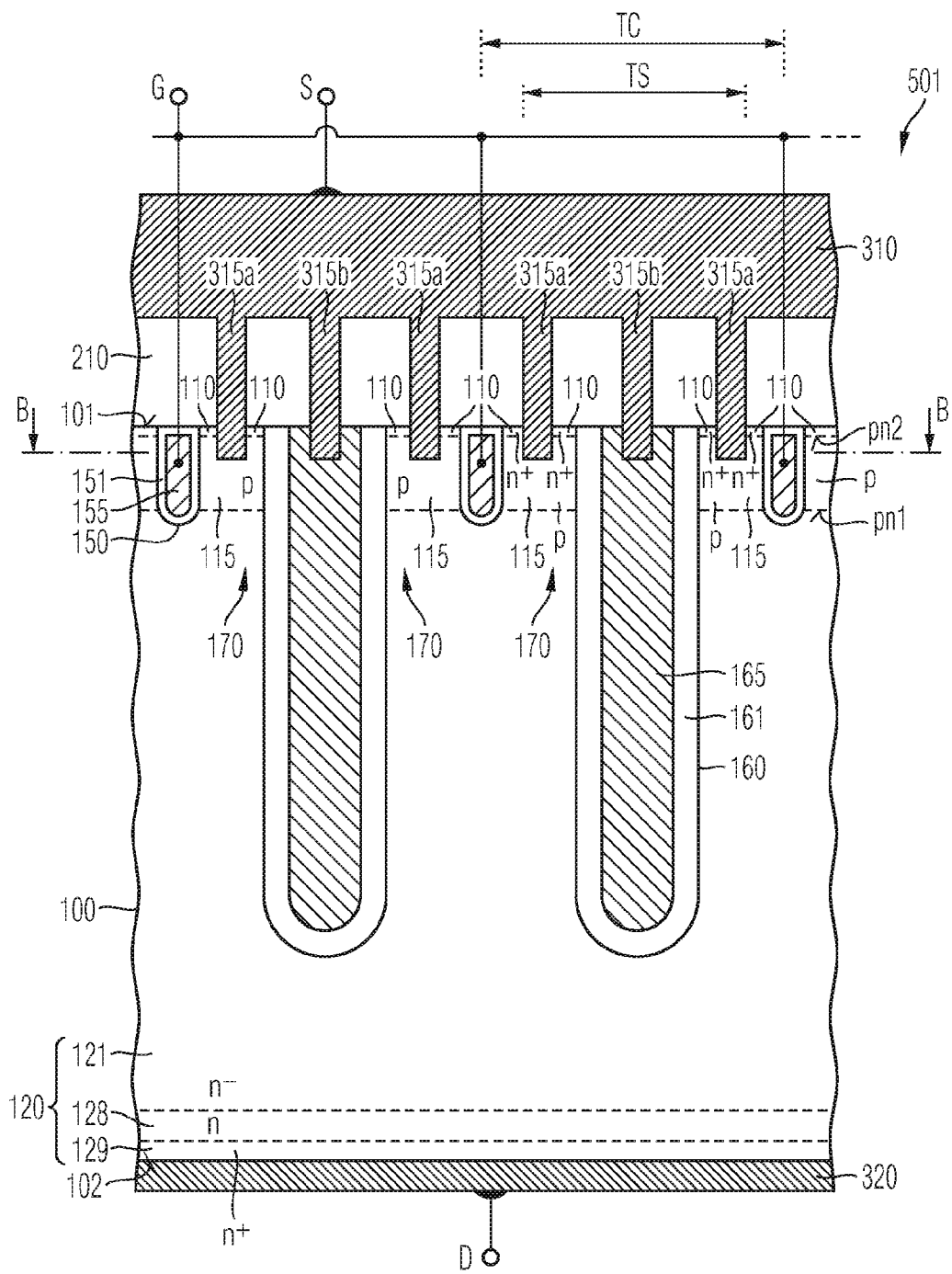
FIG. 6A is a schematic vertical cross-sectional view of a portion of an IGFET according to an embodiment including transistor cells formed along shifted lines.
Figure 6B:
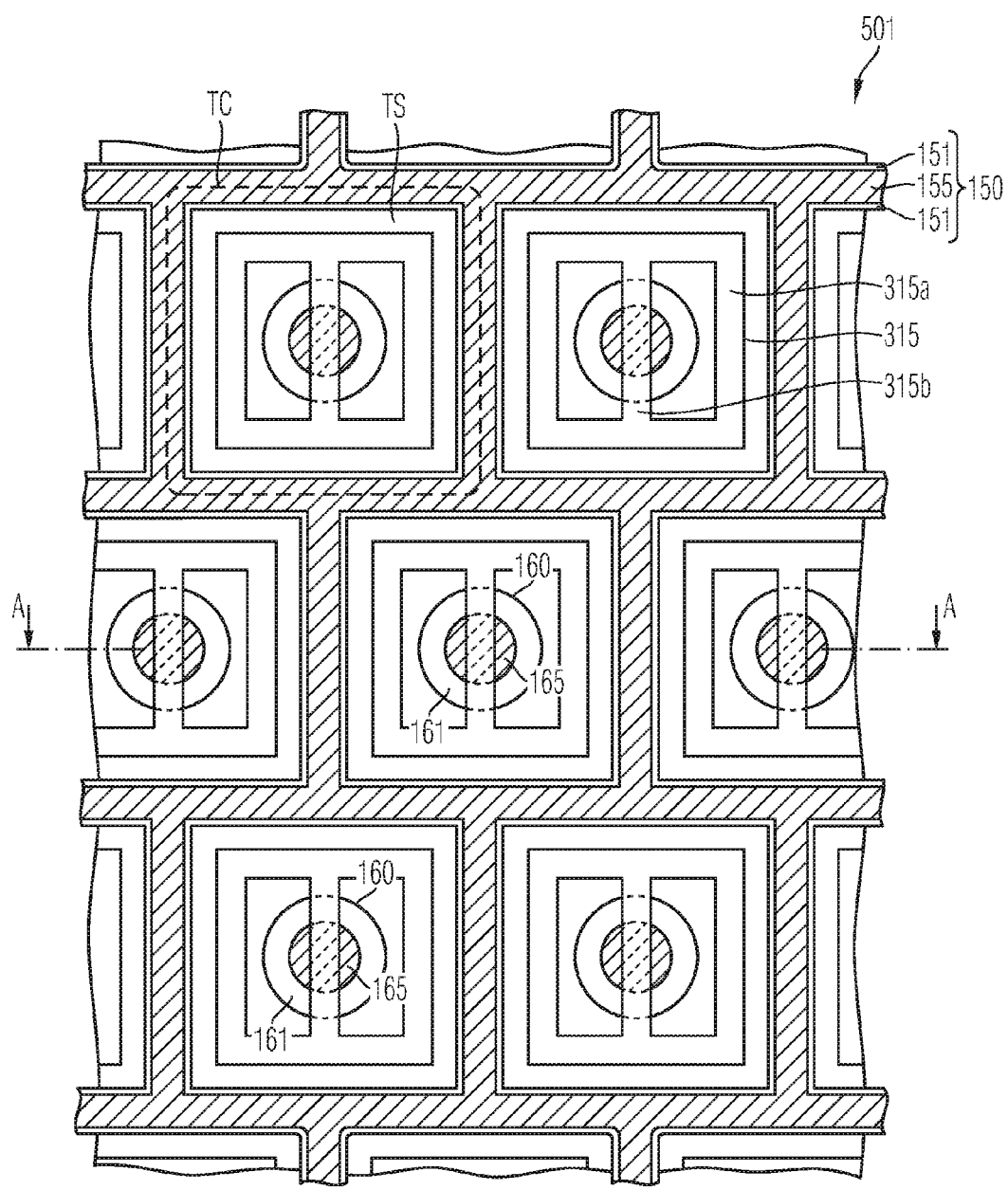
FIG. 6B is a schematic horizontal cross-sectional view of the portion of the IGFET of FIG. 6A.

FIGS. 6A to 6B show an IGFET 501 based on a semiconductor portion 100 including transistor cells TC with a gate structure 150 forming a grid pattern and with spicular field plate structures 160 formed in meshes of the grid formed by the gate structure 150 as described in detail with respect to FIGS. 1A to 1B, wherein the first load terminal is a source terminal S and the second load terminal is a drain terminal D. The first load electrode 310 may be a metal structure and the dielectric structure 210 may separate the first load electrode 310 from the semiconductor portion 100.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

The contact structures 315 extend through openings in the dielectric structure 210 and electrically connect the first load electrode 310 with the source zones 110, the body zones 115 and the field electrodes 165. The contact structures 315 may include one or more conductive metal containing layers, e.g., diffusion barrier layers and/or adhesive layers, which are based on, e.g., titanium or tantalum as well as a metal fill layer containing, e.g., sputtered tungsten. Vertical center axes of the contact structures 315 coincide with vertical center axes of the field plate structures 160 wherein a displacement between the vertical axes is within lithographic overlay tolerances.

The transistor cells TC of the IGFET 501 may form a matrix as illustrated in FIGS. 1B and 1C.

FIG. 6B illustrates an embodiment with the transistor cells TC formed in lines, wherein even lines are shifted with respect to odd lines by half a center-to-center distance between neighboring transistor cells TC.

Figure 7A:
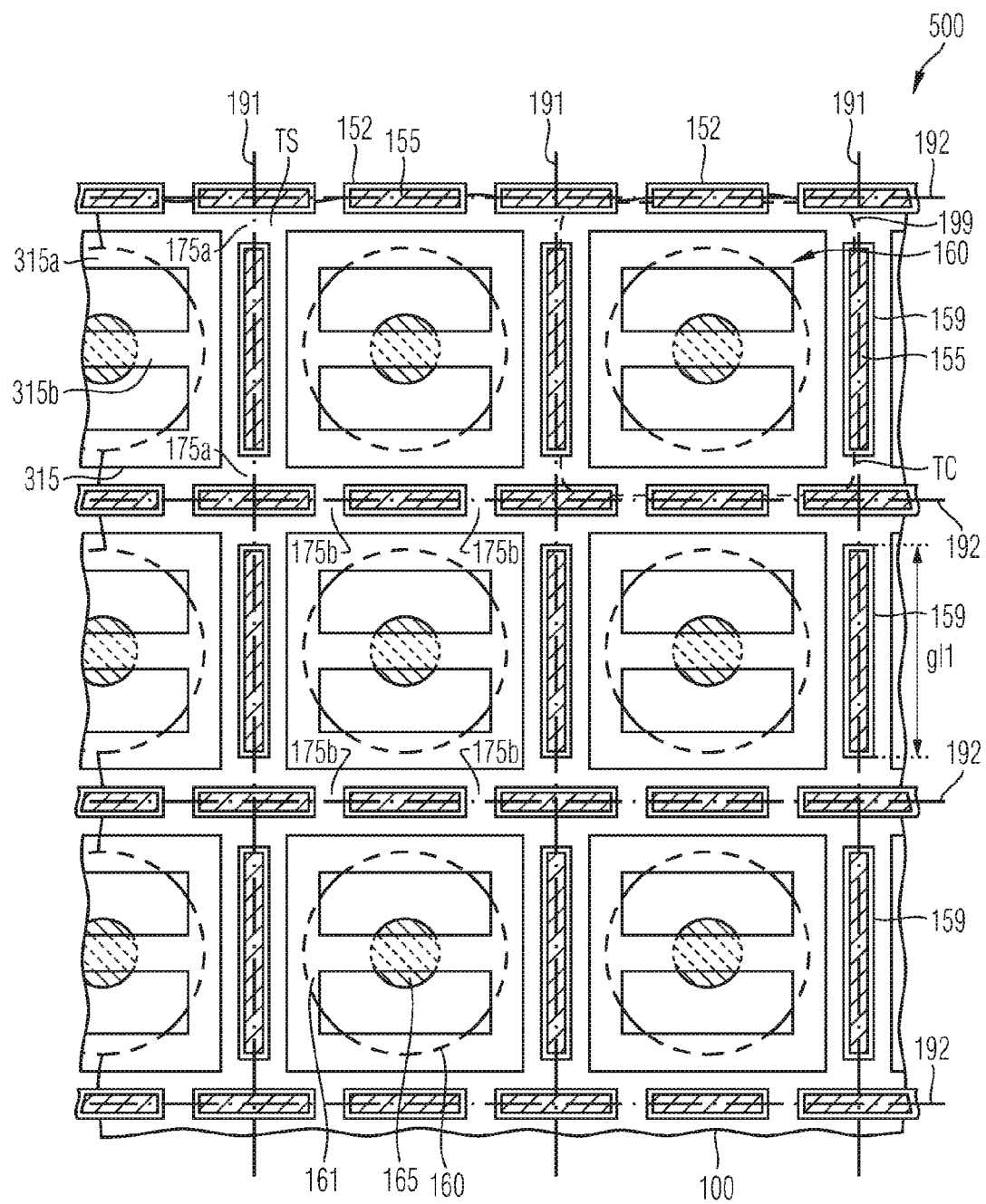
FIG. 7A is a schematic horizontal cross-sectional view of a portion of a semiconductor device according to an embodiment including gate fins.

FIG. 7A refers to a semiconductor device 500 with the gate structure 150 including a plurality of first gate fins 159 formed along first element lines 191 and second gate fins 152 formed along second element lines 192 that intersect or are tangent to the first element lines 191, for example at an angle of 90 or 120°. The first element lines 191 are separated from each other and the second element lines 192 are separated from each other. The first and second element lines 191, 192 may form a grid with the field plate structures 160 formed in the centers of the meshes 199 of the grid. At least the first element lines 191 may be continuous lines, e.g., straight lines, zig-zag lines or curved lines and run side-byside along the same direction. Neighboring first element lines 191 may be symmetric to each other with respect to an intermediate symmetry axis, e.g., the first element lines 191 may be parallel to each other.

The second element lines 192 may be continuous lines, e.g., continuous straight, zig-zag or curved lines or may be discontinuous lines with sections of the same second element line 192 extending tangent to two neighboring first element lines 191, respectively. The second element lines 192 may intersect or may be tangent to zig-zag first element lines 191 at the bends of the first element lines 191. The meshes 199 of the grid may be rectangles, e.g., squares, or other regular polygons such as hexagons.

First column section 175a of the transistor sections TS may separate first and second gate fins 159, 152 from each other such that the first and second gate fins 159, 152 do not cross. The column sections 175a avoid a local threshold shift without widening the gate electrodes, hence, without adversely affecting the reliability of the gate dielectric 151. The first column sections 175a may separate first gate fins 159, which longitudinal axes are oriented along parallel, straight first element lines 191, from second gate fins 152, which longitudinal axes are oriented along parallel, straight second element lines 192 orthogonal to the first element lines 191. The transistor sections TS may further include second column sections 175b separating neighboring second gate fins 152 or neighboring first gate fins 159 from each other. By reducing the effective overlap area between the gate electrode 155 and the drift structure 120, the first and second column sections 175a, 175b reduce the gate-to-drain capacity Cgd.

A length of the first gate fins 159 may be approximately equal to a length of the second gate fins 152. The width of the first column sections 175a may be approximately equal to a width of the second column sections 175b. The gate fins 159, 152 may be connected to each other in a wiring layer outside the semiconductor portion 100. The embodiment may be combined with any of the contact structures 315 as described above.

Figure 7B:
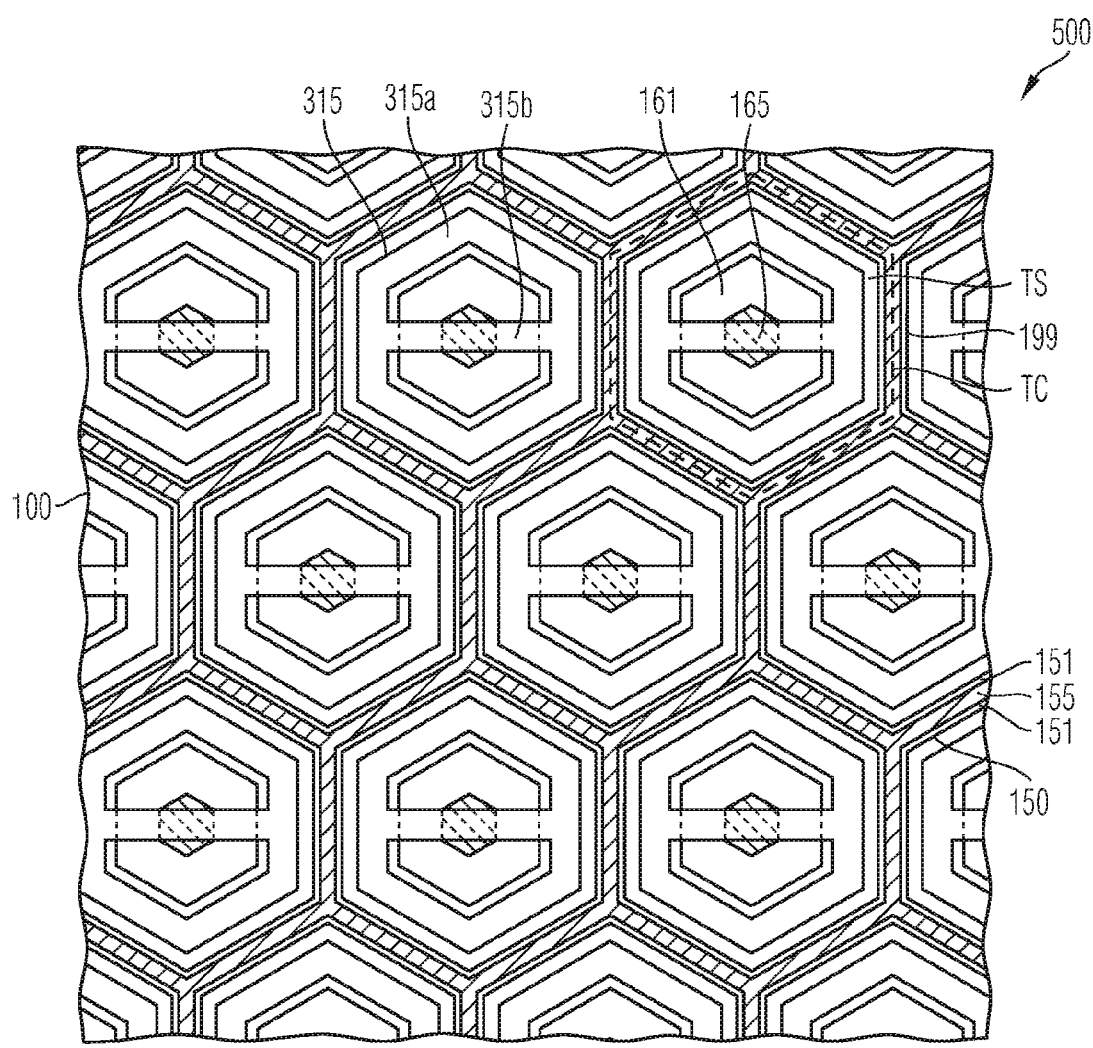
FIG. 7B is a schematic horizontal cross-sectional view of a portion of a semiconductor device according to an embodiment including hexagonal transistor cells.

In FIG. 7B, a continuous gate structure 150 forms a grid with hexagonal meshes, wherein within typical mask alignment tolerances centers of the field plate structures 160 coincide with centers of the meshes and the centers of the contact structures 315.

The first portion 315a of the contact structure 315 includes six stripes of uniform width which form a regular hexagon. An inner contour of the first portion 315a may be evenly spaced from an outer contour of the field dielectric 161 and does not overlap with the field dielectric 161.

FIG. 7C shows a semiconductor device 500 with field plate structures 160 arranged in a matrix with lines and rows. A horizontal cross-sectional area of the field plate structures 160 forms a circle. A contact structure 315 includes a first portion 315a forming a ring that may partially overlap with the transistor section TS and the field dielectric 161 in the vertical projection. An overlap between the first portion 315a and the transistor section TS may have approximately uniform width.

Figure 8A:
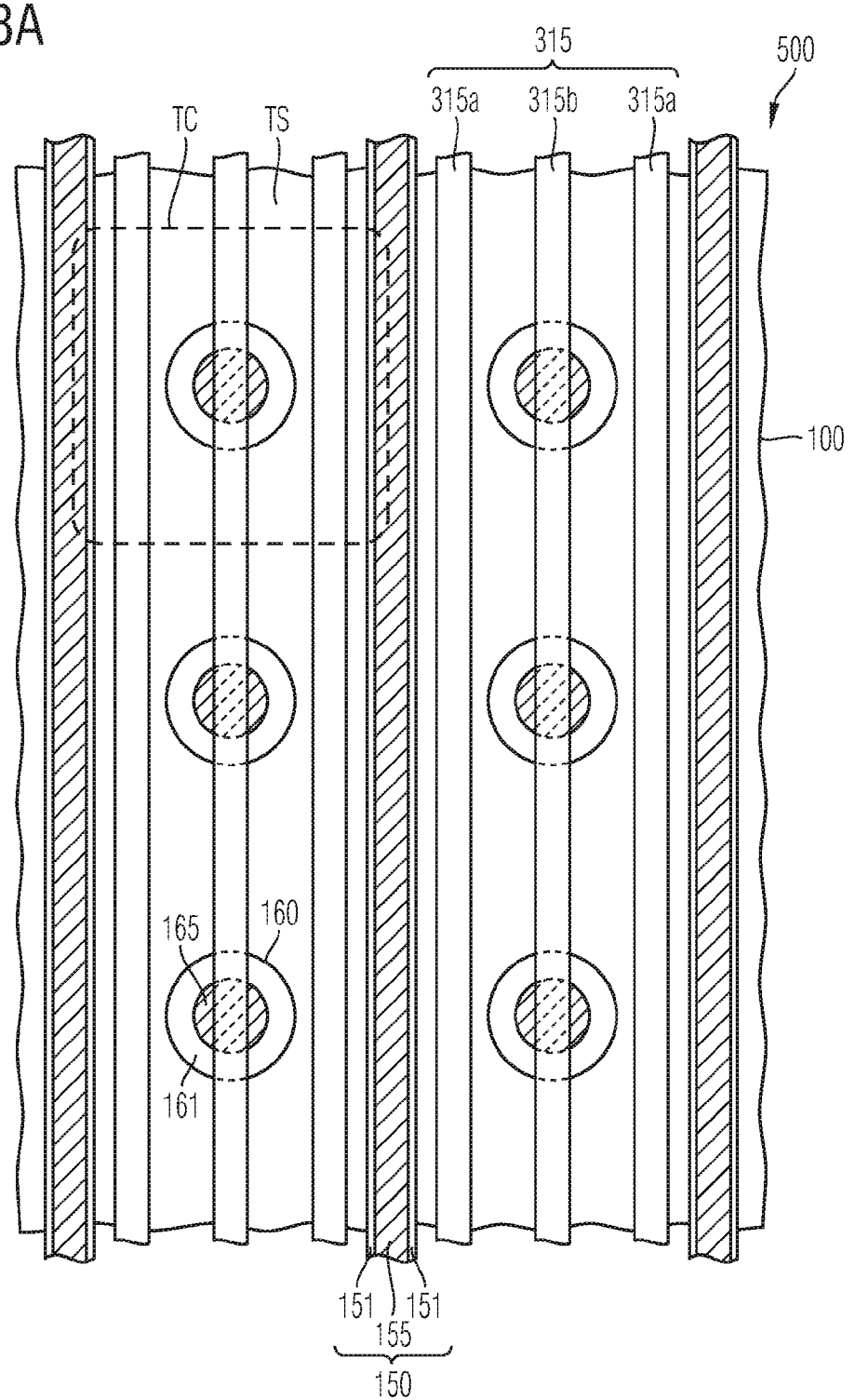
FIG. 8A is a schematic horizontal cross-sectional view of a portion of a semiconductor device according to another embodiment including stripe-shaped gate structures and contact structures with continuous, parallel first and second portions.
Figure 8B:
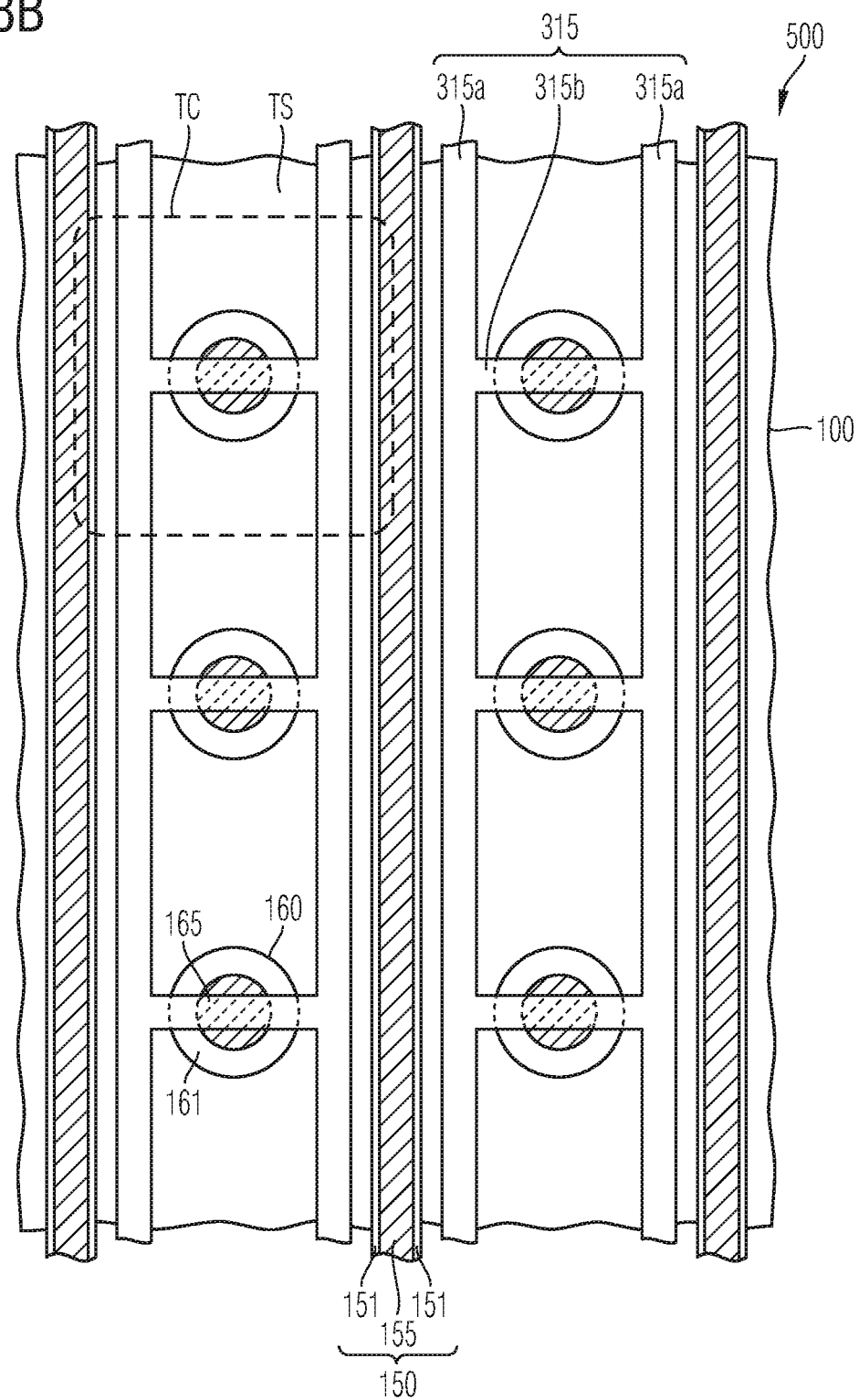
FIG. 8B is a schematic horizontal cross-sectional view of a portion of a semiconductor device according to an embodiment including stripe-shaped gate structures and contact structures with first portions forming rails and second portions forming rungs of a ladder-like structure.

The semiconductor devices 500 of FIGS. 8A to 8C include stripe-shaped gate structures 150 extending from a first surface 101 into a semiconductor portion 100 and separating neighboring transistor sections TS of the semiconductor portion 100. Field plate structures 160 extend from the first surface 101 into the transistor sections TS. Each field plate structure 160 includes a field electrode 165. Mesa sections 170 of the semiconductor portion 100 separate the field plate structures 160 from each other and from the gate structures 150. Contact structures 315 include first portions 315a directly adjoining the mesa sections 170 and second portions 315b directly adjoining the field electrodes 165. Both the first and second portions 315a, 315b include or consist of stripes of uniform width.

In the embodiment of FIG. 8A the first portions 315a of contact structures 315 assigned to transistor cells TC formed between the same pair of neighboring gate structures 150 are connected to each other along the longitudinal axis and are laterally separated from the second portions 315b, wherein the first portions 315a and the second portions 315b run parallel to each other and parallel to the gate structures 150. According to another embodiment, the first and second portions 315a, 315b may run perpendicular to the gate structures 150.

In FIG. 8B the first portions 315a form rails and the second portions 315b form rungs of a ladder-like contact structure 315 with a longitudinal axis parallel to longitudinal axes of the gate structures 150. End faces of the stripe-shaped second portions 315b are directly connected to the continuous first portions 315a.

In FIG. 8C the first portions 315a are arranged along lines parallel to the longitudinal axes of the gate structures 150 and longitudinal axes of second portions 315b, which are separated from the first portions 315a, run perpendicular to the longitudinal axes of the gate structures 150.

Figure 9:
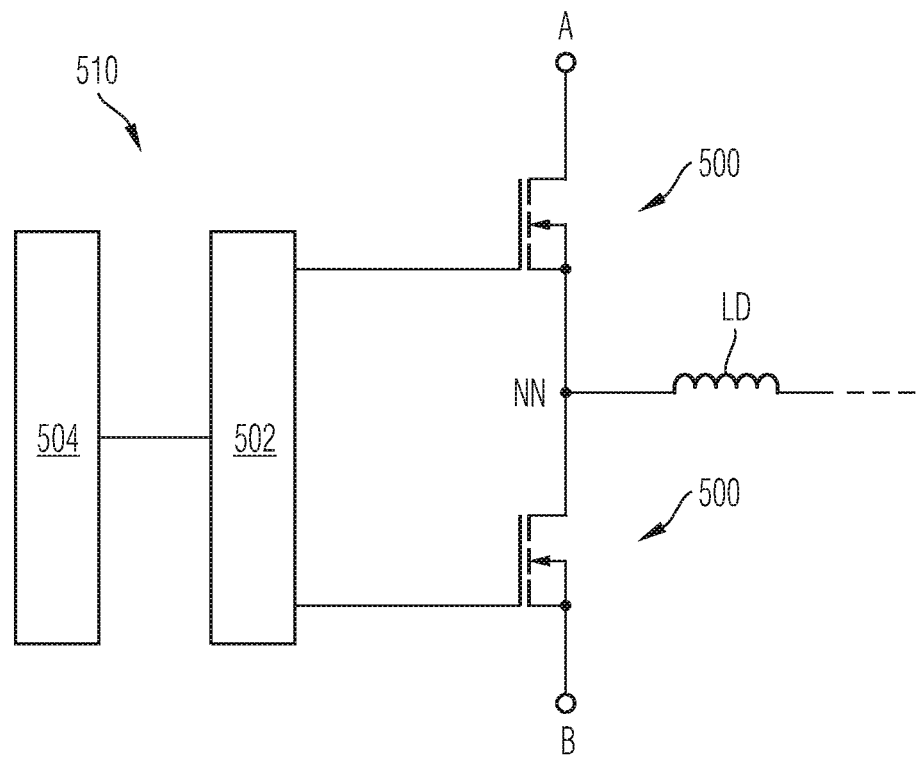
FIG. 9 is a schematic circuit diagram of an electronic assembly according to an embodiment related to switch-mode power supplies and motor drives.

FIG. 9 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly may further include a control circuit 504 configured to supply a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

According to another embodiment, the electronic assembly 510 may be a primary side stage of a switched mode power supply with the supply terminals A, B supplying an AC voltage of an input frequency to the electronic circuit 510. The network node NN is electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 510 may be a primary side stage of a DC-to-DC converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC converter, e.g., a power optimizer or a micro-inverter for applications including photovoltaic cells, wherein the electronic circuit 510 supplies an output voltage to the supply terminals A, B and wherein the network node NN is electrically connected to the inductive storage element.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a gate structure extending from a first surface into a semiconductor portion and surrounding a transistor section of the semiconductor portion;
   a field plate structure extending from the first surface into the transistor section and comprising a field electrode;
   a mesa section of the transistor section separating the field plate structure and the gate structure; and
   a contact structure comprising a first portion directly adjoining the mesa section and a second portion directly adjoining the field electrode, wherein the first and second portions include stripes and are directly connected to each other.

2. The semiconductor device of claim 1, wherein the first portion includes stripes forming a closed, polygonal frame in a horizontal cross-section parallel to the first surface.

3. The semiconductor device of claim 1, wherein the first portion includes stripes forming a closed, regular polygonal frame in a horizontal cross-section parallel to the first surface.

4. The semiconductor device of claim 1, wherein the first portion includes four stripes forming a closed square frame in a horizontal cross-section parallel to the first surface.

5. The semiconductor device of claim 1, wherein the first portion forms a closed oval frame in a horizontal cross-section.

6. The semiconductor device of claim 1, wherein the second portion comprises a stripe extending from the first portion to a vertical projection of the field electrode, and wherein the vertical projection is perpendicular to the first surface.

7. The semiconductor device of claim 6, wherein the second portion includes a stripe and both end faces of the stripe directly adjoin the first portion.

8. The semiconductor device of claim 1, wherein the first portion includes at least four straight stripes forming a closed frame, and wherein the second portion extends through an opening of the frame and crosses a center of the opening.

9. The semiconductor device of claim 1, wherein the first portion is formed at a horizontal distance to the field plate structure.

10. The semiconductor device of claim 1, wherein the first portion overlaps with a vertical projection of the field plate structure perpendicular to the first surface.

11. The semiconductor device of claim 1, wherein the mesa section includes body zones forming a first pn junction with a drift structure and second pn junctions with source zones formed between the body zones and the first surface.

12. The semiconductor device of claim 11, wherein the gate structure includes a gate electrode and a gate dielectric separating the gate electrode from the body zones.

13. The semiconductor device of claim 1, wherein the gate structure forms a grid and a mesh of the grid includes the transistor section and the field plate structure.

14. The semiconductor device of claim 1, wherein the first and second portions comprise stripes of uniform width.

15. A semiconductor device, comprising:
    gate structures extending from a first surface into a semiconductor portion and defining transistor sections of the semiconductor portion between neighboring ones of the gate structures;
    spicular field plate structures extending from the first surface into the transistor sections and including field electrodes;
    mesa sections of the transistor sections separating the field plate structures from each other and from the gate structures; and
    contact structures each of which comprises a first portion directly adjoining one of the mesa sections and a second portion directly adjoining one of the field electrodes, wherein the first and second portions include stripes.

16. The semiconductor device of claim 15, wherein the first and second portions are directly connected to each other along a direction horizontal to the first surface.

17. The semiconductor device of claim 15, wherein the first portions of the contact structures assigned to neighboring ones of the field plate structures in a same transistor section are connected to each other along a longitudinal axis of the first portions.

18. The semiconductor device of claim 15, wherein the first portions of the contact structures assigned to neighboring ones of the field plate structures in a same transistor section are separated from each other.

19. The semiconductor device of claim 15, wherein the first and second portions are parallel stripes.

20. An electronic assembly, comprising:
    a semiconductor device comprising:
    a gate structure including a gate electrode and extending from a first surface into a semiconductor portion and surrounding a transistor section of the semiconductor portion;
    a field plate structure extending from the first surface into the transistor section and comprising a field electrode;
    a mesa section of the transistor section separating the field plate structure and the gate structure; and
    a contact structure comprising a first portion directly adjoining the mesa section and a second portion directly adjoining the field electrode, wherein the first and second portions include stripes and are directly connected to each other; and
    a gate driver circuit electrically connected or coupled to the gate electrode.

* * * * *